(12) United States Patent
Shiokawa et al.

(10) Patent No.: US 10,937,480 B2
(45) Date of Patent: *Mar. 2, 2021

(54) SPIN CURRENT MAGNETIZATION ROTATIONAL ELEMENT, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/751,318

(22) Filed: Jan. 24, 2020

(65) Prior Publication Data

US 2020/0160900 A1 May 21, 2020

Related U.S. Application Data

(62) Division of application No. 15/956,523, filed on Apr. 18, 2018, now Pat. No. 10,580,470.

(30) Foreign Application Priority Data

Apr. 21, 2017 (JP) .............................. JP2017-084537

(51) Int. Cl.
*G11C 11/00* (2006.01)
*G11C 11/16* (2006.01)
(Continued)

(52) U.S. Cl.
CPC .......... *G11C 11/161* (2013.01); *G01R 33/098* (2013.01); *G11C 11/1659* (2013.01);
(Continued)

(58) Field of Classification Search
CPC .............. G11C 11/161; G11C 11/1659; G11C 11/1673; G11C 11/1675; H01L 43/08; H01L 43/10; H01L 43/12
See application file for complete search history.

(56) References Cited

U.S. PATENT DOCUMENTS

| 8,350,347 B2 | 1/2013 | Gaudin et al. |
| 9,076,537 B2 | 7/2015 | Khvalkovskiy et al. |

(Continued)

FOREIGN PATENT DOCUMENTS

| JP | 2005-294376 A | 10/2005 |
| JP | 2006-040960 A | 2/2006 |

(Continued)

OTHER PUBLICATIONS

Miron et al., "Perpendicular switching of a single ferromagnetic layer induced by in-plane current injection;" Nature; vol. 189, Aug. 11, 2011.

(Continued)

*Primary Examiner* — Toan K Le
(74) *Attorney, Agent, or Firm* — Oliff PLC (57) ABSTRACT

A spin current magnetization rotational element including a first ferromagnetic metal layer in which a magnetization direction is variable, and a spin-orbit torque wiring that extends in a second direction intersecting a first direction that is a plane-orthogonal direction of the first ferromagnetic metal layer, and is joined to the first ferromagnetic metal layer. The first ferromagnetic metal layer has a lamination structure including a plurality of ferromagnetic constituent layers and a plurality of nonmagnetic constituent layers which are respectively interposed between the ferromagnetic constituent layers adjacent to each other. At least one ferromagnetic constituent layer among the plurality of ferromagnetic constituent layers has a film thickness different from a film thickness of the other ferromagnetic constituent (Continued)

layers, and/or at least one nonmagnetic constituent layer among the plurality of nonmagnetic constituent layers has a film thickness different from a film thickness of the other nonmagnetic constituent layers.

20 Claims, 5 Drawing Sheets

(51) Int. Cl.
- *G01R 33/09* (2006.01)
- *H01L 43/12* (2006.01)
- *H01L 43/10* (2006.01)
- *H01L 43/08* (2006.01)
- *H01L 43/02* (2006.01)

(52) U.S. Cl.
CPC ...... *G11C 11/1673* (2013.01); *G11C 11/1675* (2013.01); *H01L 43/02* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 10,580,470 B2* | 3/2020 | Shiokawa | G11C 11/1659 |
| 2005/0219767 A1 | 10/2005 | Nakamura et al. | |
| 2006/0017082 A1 | 1/2006 | Fukuzumi et al. | |
| 2008/0089117 A1 | 4/2008 | Sugibayashi et al. | |
| 2009/0034135 A1 | 2/2009 | Hoshiya et al. | |
| 2014/0063921 A1 | 3/2014 | Tang et al. | |
| 2014/0312441 A1 | 10/2014 | Guo | |
| 2015/0348606 A1 | 12/2015 | Buhrman et al. | |
| 2016/0233416 A1 | 8/2016 | Ikeda et al. | |
| 2017/0077177 A1 | 3/2017 | Shimomura et al. | |
| 2017/0222135 A1 | 8/2017 | Fukami et al. | |
| 2018/0114898 A1 | 4/2018 | Lee | |
| 2018/0159026 A1 | 6/2018 | Shiokawa et al. | |

FOREIGN PATENT DOCUMENTS

| | | |
|---|---|---|
| JP | 2009-026400 A | 2/2009 |
| JP | 2017-059679 A | 3/2017 |
| JP | 2018-067701 A | 4/2018 |
| WO | 2016/021468 A1 | 2/2016 |

OTHER PUBLICATIONS

Fukami et al., "A spin-orbit torque switching scheme with collinear magnetic easy axis and current configuration;" Nature Nanotechnology; DOI: 10.1038/NNANO.2016.29, Mar. 21, 2016.

Kato et al., "Observation of the Spin Hall Effect in Semiconductors;" Science; vol. 306, Dec. 10, 2004.

Liu et al., "Spin-Torque Switching with the Giant Spin Hall Effect of Tantalum;" Science; vol. 336, May 4, 2012.

Liu et al., "Current-Induced Switching of Perpendicularly Magnetized Magnetic Layers;" Physical Review Letters; 109; Aug. 31, 2012.

Lee et al., "Threshold current for switching of a perpendicular magnetic layer induced by spin Hall effect;" Applied Physics Letters; 102; Mar. 20, 2013.

Lee et al., "Thermally activated switching of perpendicular magnet by spin-orbit spin torque;" Applied Physics Letters; 104; Feb. 21, 2014.

Fukami et al., "Magnetization switching by spin-orbit torque in an antiferromagnet-ferromagnet bilayer system;" Nature Materials; DOI: 10.1038/NMAT4566; Feb. 15, 2016.

Takahashi et al; "Spin injection and detection in magnetic nanostructures;" Physical Review B; vol. 67; Feb. 28, 2003.

Seo et al., "Area-Efficient SOT-MRAN With a Schottky Diode;" IEEE Electron Device Leters, vol. 37; No. 8; Aug. 2016.

Zhang et al., "Spin Hall Effects in Metallic Antiferromagnets;" Physical Review Letters; 113; Nov. 7, 2014.

May 1, 2019 Office Action issued in U.S. Appl. No. 15/956,523.

* cited by examiner

FIG. 4D $t1 \neq t2 \neq t3$
$t1 \neq t2 = t3$
$t1 = t2 \neq t3$

▨ NONMAGNETIC CONSTITUENT LAYER
▨ FERROMAGNETIC CONSTITUENT LAYER

FIG. 5C $t1 \neq t2 \neq t3$
$t1 \neq t2 = t3$
$t1 = t2 \neq t3$

FIG. 5F $t1 \neq t2 \neq t3$
$t1 \neq t2 = t3$
$t1 = t2 \neq t3$

☐ NONMAGNETIC CONSTITUENT LAYER
▨ FERROMAGNETIC CONSTITUENT LAYER

FIG. 6

SPIN CURRENT MAGNETIZATION ROTATIONAL ELEMENT, MAGNETORESISTANCE EFFECT ELEMENT, AND MAGNETIC MEMORY

This is a Division of application Ser. No. 15/956,523, filed Apr. 18, 2018, which claims the benefit of Japanese Patent Application No. 2017-084537, filed Apr. 21, 2017, the content of which is incorporated herein by reference.

BACKGROUND OF THE INVENTION

Field of the Invention

The present disclosure relates to a spin current magnetization rotational element, and more particularly, to a spin current magnetization reversal element. In addition, the disclosure also relates to a magnetoresistance effect element and a magnetic memory.

Description of Related Art

A giant magnetoresistive (GMR) element that is constituted by a multi-layer film of a ferromagnetic layer and a nonmagnetic layer, and a tunnel magnetoresistive (TMR) element using an insulating layer (a tunnel barrier layer, a barrier layer) as a nonmagnetic layer are known. Typically, the TMR element has higher element resistance in comparison to the GMR element, but the magnetoresistance (MR) ratio of the TMR element is greater than the MR ratio of the GMR element. According to this, the TMR element has attracted attention as an element for a magnetic sensor, a high-frequency component, a magnetic head, and a nonvolatile random access memory (MRAM).

The MRAM reads and writes data by using characteristics in which when magnetization directions of two ferromagnetic layers, between which an insulating layer is provided, vary, element resistance of the TMR element varies. As a recording type of the MRAM, a type in which recording (magnetization reversal) is performed by using a magnetic field formed by a current, and a type in which recording (magnetization reversal) is performed by using spin transfer torque (STT) that occurs when a current is allowed to flow in a lamination direction of a magnetoresistance effect element are known. The magnetization reversal of the TMR element which uses STT is efficient from the viewpoint of energy efficiency, but a reversal current density for magnetization reversal is high. It is preferable that the reversal current density is low from the viewpoint of a long operational lifespan of the TMR element. This preference is also true of the GMR element.

Accordingly, in recent years, as means for reducing a reversal current with a mechanism different from the STT, magnetization reversal using a pure spin current generated by a spin hall effect has attracted attention (for example, refer to I. M. Miron, K. Garello, G. Gaudin, P. J. Zermatten, M. V. Costache, S. Auffret, S. Bandiera, B. Rodmacq, A. Schuhl, and P. Gambardella, Nature, 476, 189 (2011)). The pure spin current, which is generated by the spin hall effect, causes spin-orbit torque (SOT), and causes magnetization reversal by the SOT. Alternatively, in a pure spin current that is generated by an interface rashba effect at an interface between different kinds of materials, magnetization reversal is caused by the same SOT. The pure spin current is generated when the same numbers of upward spin electrons and downward spin electrons flow in directions opposite to each oilier, and flows of charges are canceled. According to this, a current that flows to a magnetoresistance effect element is zero, and thus realization of a magnetoresistance effect element having a small reversal current density is expected.

The spin hail effect depends on the magnitude of spin orbit interaction. In S. Fukami, T. Anekawa, C. Zhang, and H. Ohno, Nature Nanotechnology, DOI:10.1038/NNANO.2016.29, Ta that is a heavy metal having a "d" electron that causes spin orbit interaction is used in a spin-orbit torque wiring. In addition, in GaAs that is a semiconductor, it is known that the spin orbit interaction occurs due to an electric field, which is generated due to collapse of reversal symmetry, inside a crystal.

SUMMARY OF THE INVENTION

Problems to be Solved by the Invention

According to S. Fukami, T. Anekawa, C. Zhang, and H. Ohno, Nature Nanotechnology, DOI:10.1038/NNANO.2016.29, it is reported that a reversal current density by the SOT type is approximately the same as a reversal current density by the STT type. However, the reversal current density that is reported in the current SOT type not sufficient to realize high integration and low energy consumption, and thus there is room for improve ent.

In addition, examples of a material that is used in the spin-orbit torque wiring (wiring that causes SOT and generates a pure spin current) of the magnetoresistance effect element of the SOT type include a heavy metal material including Ta similar to the material that is used in S. Fukami, T. Anekawa, C. Zhang, and H. Ohno, Nature Nanotechnology, DOI:10.1038/NNANO.2016.29. The heavy metal material has high electric resistivity. Therefore, when the heavy material is used as a thin film or a thin wire, there is a problem that power consumption is high.

The disclosure has been made in consideration of the above-described problem, and an object thereof is to provide a spin current magnetization rotational element, a magnetoresistance effect element, and a magnetic memory which are capable of reducing the current density of magnetization rotation or magnetization reversal.

Means for Solving the Problems

In an SOT-type magnetoresistance effect element including a spin-orbit torque wiring, with respect to a current that intrudes into a ferromagnetic metal layer that is a magnetization-free layer joined to the spin-orbit torque wiring, the present inventors used a ferromagnetic metal layer having a lamination structure of [ferromagnetic layer/nonmagnetic layer]$_n$ (n is the number of times of repetitive lamination) to make the lamination structure be an asymmetric structure, thereby avoiding or reducing cancellation of a pure spin current. As a result, the prevent inventors have accomplished the disclosure in which the pure spin current that is generated is used for magnetization rotation or magnetization reversal.

The disclosure provides the following means to accomplish the object.

(1) According to a first aspect of the disclosure, there is provided a spin current magnetization rotational element including: a first ferromagnetic metal layer in which a magnetization direction is variable; and a spin-orbit torque wiring that extends in a second direction intersecting a first direction that is a plane-orthogonal direction of the first ferromagnetic metal layer, and is joined to the first ferromagnetic metal layer. The first ferromagnetic metal layer has a lamination structure including a plurality of ferromagnetic constituent layers and a plurality of nonmagnetic constituent layers which are respectively interposed between the ferromagnetic constituent layers adjacent to each other. At least one ferromagnetic constituent layer among the plurality of ferromagnetic constituent layers has a film thickness different from the film thickness of the other ferromagnetic constituent layers, and/or at least one nonmagnetic constituent layer among the plurality of nonmagnetic constituent layers has a film thickness different from a film thickness of the other nonmagnetic constituent layers.

(2) In the spin current magnetization rotational element according to the aspect, thicknesses of two ferromagnetic constituent layers, between which one nonmagnetic constituent layer among the plurality of nonmagnetic constituent layers is interposed, among the plurality of ferromagnetic constituent layers may be different from each other, or film thicknesses of two nonmagnetic constituent layers, between which one ferromagnetic constituent layer among the plurality of ferromagnetic constituent layers is interposed, among the plurality of nonmagnetic constituent layers may be different from each other.

(3) In the spin current magnetization rotational element according to the aspect, among the plurality of nonmagnetic constituent layers, a nonmagnetic laminated layer that is the closest to the spin-orbit torque wiring may be thinner than the other nonmagnetic laminated layers.

(4) In the spin current magnetization rotational element according to the aspect, among the plurality of nonmagnetic constituent layers, a material of at least one nonmagnetic constituent layer may be different from a material of the other nonmagnetic constituent layers.

(5) In the spin current magnetization rotational element according to the aspect, the nonmagnetic constituent layers may be formed from a material that applies interface-orthogonal magnetic anisotropy to the ferromagnetic constituent layers.

(6) In the spin current magnetization rotational element according to the aspect, among the plurality of ferromagnetic constituent layers, a ferromagnetic constituent layer that is closest to the spin-orbit torque wiring may be thinner than the other ferromagnetic constituent layers.

(7) In the spin current magnetization rotational element according to the aspect, any one ferromagnetic constituent layer among the plurality ferromagnetic constituent layers may include a dead layer.

(8) In the spin current magnetization rotational element according to the aspect, with respect to an average film thickness of the plurality of ferromagnetic constituent layers, a film thickness of each of the ferromagnetic constituent layers may be different from the average film thickness by ±10% or more, or with respect to an average film thickness of the plurality of nonmagnetic constituent layers, the film thickness of each of nonmagnetic laminated layers may be different from the average film thickness of the nonmagnetic laminated layers by ±10% or more.

(9) In the spin current magnetization rotational element according to the aspect, as the first ferromagnetic metal layer is closer to the spin-orbit torque wiring, a cross-sectional area of a cross-section that is orthogonal to the first direction may be enlarged.

(10) In the spin current magnetization rotational element according to the aspect, the sheet resistance of the first ferromagnetic metal layer may be smaller than the sheet resistance of the spin-orbit torque wiring.

(11) In the spin current magnetization rotational element according to the aspect, a material of the ferromagnetic constituent layers may be selected from ferromagnetic metals including any one of Fe, Co, and Ni, and a material of the nonmagnetic constituent layers may be selected from nonmagnetic metals including any one of Ti, Cr, Cu, Mo, Ru, Rh, Pd, Ag, Hf, Ta, W, Ir, Pt, Au, and Bi.

(12) in the spin current magnetization rotational element according to the aspect, the ratio of the length of the first ferromagnetic metal layer along the second direction to the thickness of the first ferromagnetic metal layer may be 1 or greater.

(13) According to a second aspect of the disclosure, there is provided a magnetoresistance effect element including: the spin current magnetization rotational element according to the aspect; a second ferromagnetic metal layer in which a magnetization direction is fixed; and a nonmagnetic layer that is interposed between the first ferromagnetic metal layer and the second ferromagnetic metal layer.

(14) In the magnetoresistance effect element according to the aspect, among the plurality of ferromagnetic constituent layers, the film thickness of a ferromagnetic constituent layer that is in contact with the nonmagnetic layer may be the smallest.

(15) According to a third aspect of the disclosure, there is provided a magnetic memory including a plurality of the magnetoresistance effect elements according to the aspect.

Effects of the Invention

According to the spin current magnetization rotational element of the disclosure, it is possible to provide a spin current magnetization rotational element capable of reducing the current density of magnetization rotation or magnetization reversal.

BRIEF DESCRIPTION OF THE DRAWINGS

FIGS. 1A and 1B are schematic views of an example of a spin current magnetization rotational element according to an embodiment of the disclosure, and in the drawings.

DETAILED DESCRIPTION OF THE INVENTION

Hereinafter, the disclosure will be described in detail with reference to the accompanying drawings in an appropriate manner. Drawings used in the following description may show a characteristic portion in an enlarged manner for easy understanding of characteristics of the disclosure for convenience, and dimensional ratios and the like of respective constituent elements may be different from actual dimensional ratios and the like. Materials, dimensions, and the like which are exemplary examples in the following description are illustrative only, and the disclosure is not limited thereto. The disclosure can be carried out by appropriately making modifications in a range that exhibits an effect of the disclosure. In elements of the disclosure, another layer may be provided in a range that exhibits the effect of the disclosure.

Spin Current Magnetization Rotational Element

Figure 1A:
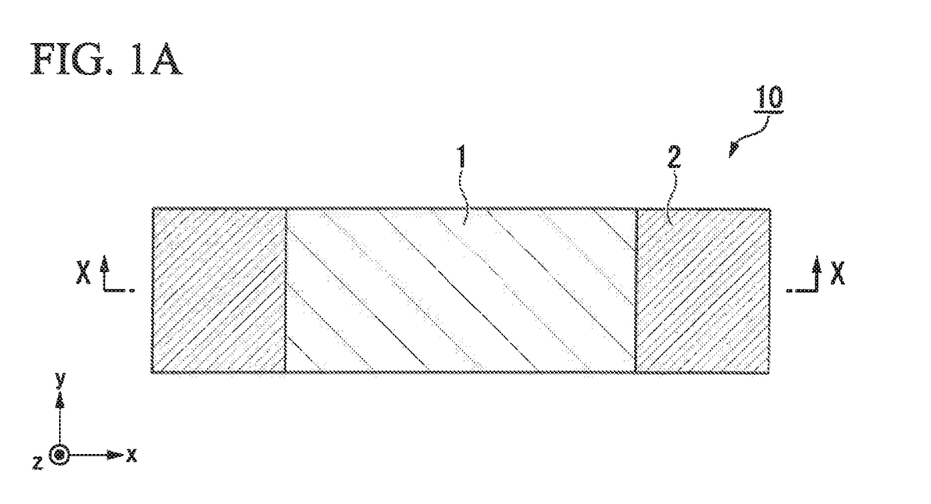
FIG. 1A is a plan view.
Figure 1B:
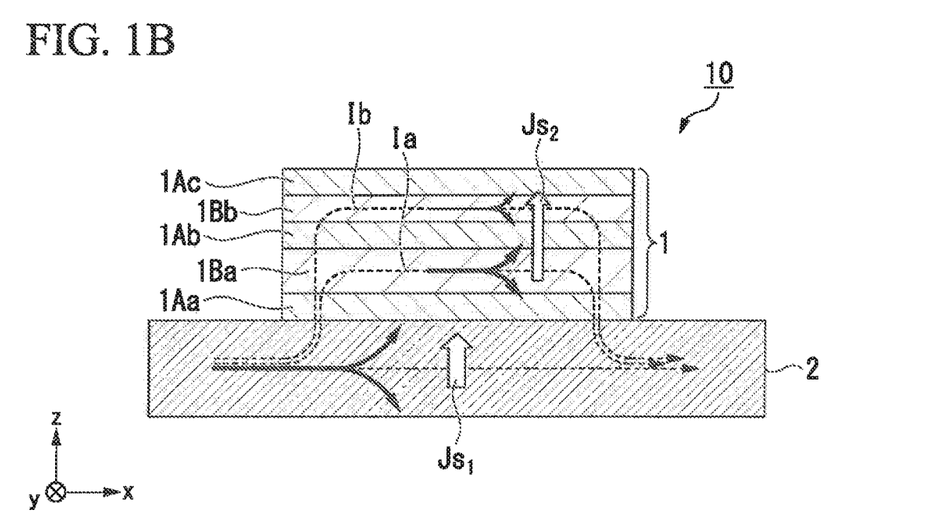
FIG. 1B is a cross-sectional view taken along line X-X that is a central line of a spin-orbit torque wiring shown in FIG. 1A in a width direction.

FIGS. 1A and 1B are schematic views showing an example of a spin current magnetization rotational element according to an embodiment of the disclosure. FIG. 1A is a plan view, and FIG. 1B is a cross-sectional view taken along line X-X that is a central line of a spin-orbit torque wiring 2 in FIG. 1A in a width direction.

A spin current magnetization rotational element 10 shown in FIGS. 1A and 1B includes a first ferromagnetic metal layer 1 in which a magnetization direction is variable, and a spin-orbit torque wiring 2 that extends in a second direction intersecting a first direction that is a plane-orthogonal direction of the first ferromagnetic metal layer 1 and is joined to the first ferromagnetic metal layer 1. The first ferromagnetic metal layer 1 has a lamination structure including a plurality of ferromagnetic constituent layers 1Aa, 1Ab, and 1Ac, and a plurality of nonmagnetic constituent layers 1Ba and 1Bb which are respectively interposed between the ferromagnetic constituent layers adjacent to each other. That is, first ferromagnetic metal layer 1 has a lamination structure including a plurality of ferromagnetic constituent layers 1Aa, 1Ab, and 1Ac, and a plurality of nonmagnetic constituent layers 1Ba and 1Bb, each of the plurality of nonmagnetic constituent layers 1Ba and 1Bb being sandwiched between two of the plurality of ferromagnetic constituent layers 1Aa, 1Ab, and 1Ac adjacent each other. the At least one ferromagnetic constituent layer among the plurality of ferromagnetic constituent layers has a film thickness different from that of the other ferromagnetic constituent layers, and/or at least one nonmagnetic constituent layer 1Ba between the plurality of nonmagnetic constituent layers 1Ba and 1Bb has a film thickness different from that of the other nonmagnetic constituent layer 1Bb.

Hereinafter, the plane-orthogonal direction of the first ferromagnetic metal layer 1 or a direction (first direction) in Which the first ferromagnetic metal layer 1 and the spin-orbit torque wiring 2 are laminated is set as a z-direction, a direction (second direction) that is orthogonal to the z-direction and is parallel to the spin-orbit torque wiring 2 is set as an x-direction, and a direction (third direction) orthogonal to the x-direction and the z-direction is set as a y-direction.

In the following description including FIGS. 1A and 1B, as an example of a configuration in which the spin-orbit torque wiring 2 extends in a direction intersecting the first direction that is a plane-orthogonal direction of the first ferromagnetic metal layer 1, a description will be given of a case of a configuration extending in a direction that is orthogonal to the first direction.

In the spin current magnetization rotational element of the embodiment, a current is allowed to flow to a spin-orbit torque wiring to generate a pure spin current, and the pure spin current is diffused to a first ferromagnetic metal layer that is in contact with the spin-orbit torque wiring. According to this, magnetization rotation of the first ferromagnetic metal layer is caused to occur by a spin-orbit torque (SOT) effect due to the pure spin current. In addition, the first ferromagnetic metal layer is formed in a predetermined lamination structure. According to this, a pure spin current is generated by a current that invades into the first ferromagnetic metal layer among currents which are allowed to flow to the spin-orbit torque wiring, and the pure spin current is also used in magnetization rotation, thereby reducing a reversal current density. When the SOT effect is sufficiently large, magnetization of the first ferromagnetic metal layer 1 is reversed. In this case, the spin current magnetization rotational element of the embodiment can be particularly referred to as "spin current magnetization reversal element" as described above.

In the spin current magnetization rotational element of the embodiment, a pure spin current due to an interface rashba effect is also used. Although a detailed mechanism of the interface rashba effect is not clear, the mechanism is considered as follows. At an interface between different kinds of materials, it is considered that space reversal symmetry collapses and thus a potential gradient exists in a plane-orthogonal direction. In a case where a current flows along an interface in which a potential gradient exists in a plane-orthogonal direction, that is, in a case where electrons move in a two-dimensional plane, an effective magnetic field acts on a spin in an in-plane direction orthogonal to a movement direction of electrons, and thus directions of the spin are arranged in the effective magnetic field. According to this, spin accumulation occurs in the interface. In addition, the spin accumulation causes a pure spin current, which is diffused to the outside of a plane, to occur.

At an interface between a ferromagnetic constituent layer and a nonmagnetic constituent layer which constitute the first ferromagnetic metal layer, spin accumulation (a state in which either an upward spin or a downward spin is rich) occurs due to the interface rashba effect, and the spin accumulation causes a pure spin current to occur. The pure spin current also contributes to magnetization rotation.

The spin current magnetization rotational element of the embodiment, that is, an element that performs magnetization rotation of a ferromagnetic metal layer by the SOT effect by the pure spin current can be used in a magnetoresistance effect element that performs magnetization reversal of the ferromagnetic metal layer by only SOT due to the pure spin current, and in this ease, the spin current magnetization rotational element can be particularly referred to as "spin current magnetization reversal element". In addition, the spin current magnetization rotational element of the embodiment can be used in a magnetoresistance effect element that uses STT in the related art as assist means or main means of magnetization reversal of the ferromagnetic metal layer.

Spin-Orbit Torque Wiring

The spin-orbit torque wiring 2 is formed from a material in which, when a current flows, a pure spin current is generated due to a spin hall effect. It is sufficient for the material to have a configuration in which a pure spin current is generated in the spin-orbit torque wiring 2.

The spin hall effect is a phenomenon in which, when a current flows to a material, a pure spin current is caused in a direction orthogonal to a direction of the current on the basis of spin orbit interaction.

Figure 2:
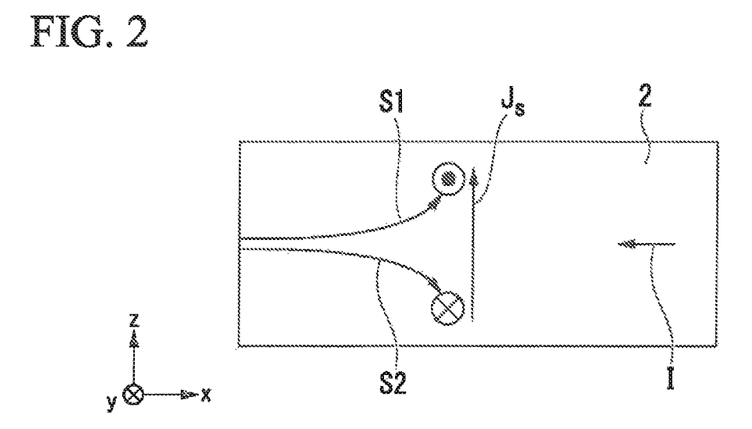
FIG. 2 is a schematic view showing a spin hall effect.

FIG. 2 is a schematic view showing the spin hall effect. FIG. 2 is a cross-sectional view obtained by cutting the spin-orbit torque wiring 2 shown in FIGS. 1A and 1B along the x-direction. A description will be given of a mechanism in which the pure spin current is generated due to the spin hall effect with reference to FIG. 2.

As shown in FIG. 2, when a current I is allowed to flow in an extension direction of the spin-orbit torque wiring 2, a first spin S1 that is oriented to a front side on a paper surface and a second spin S2 that is oriented to a back side on the paper surface are curved in a direction orthogonal to the current. A typical hall effect and the spin hall effect are common in that a movement (migration) direction of moving (migrating) charges (electrons) can be curved. However, in the typical hall effect, when receiving a Lorentz force, the movement direction of charged particles, which move in a magnetic field, can be curved. In contrast, in the spin hall effect, although the magnetic field does not exist, only when an electron migrates (only when a current flows), the migration direction of the electron can be curved. In this regard, the typical hall effect and the spin hall effect are greatly different from each other.

In a nonmagnetic substance (a material that is not a ferromagnetic substance), the number of electrons of the first spin S1, and the number of electrons of the second spin S2 are the same as each other. Accordingly, the number of electrons of the first spin S1 that faces an upward direction in the drawing, and the number of electrons of the second spin S2 that faces a downward direction are the same as each other. According to this, a current as a net flux of charges is zero. A spin current that is not accompanied with the current is particularly referred to as "pure spin current".

In a case where a current is allowed to flow through a ferromagnetic substance, the first spin S1 and the second spin S2 are curved in directions opposite to each other. In this regard, nonmagnetic substance and the ferromagnetic substance are the same as each other. On the other hand, in the ferromagnetic substance, either the first spin S1 or the second spin S2 is rich, and as a result, a net flux of charges occurs voltage occurs). In this regard, the nonmagnetic substance and the ferromagnetic substance are different from each other. Accordingly, as a material of the spin-orbit torque wiring 2, a material composed of a ferromagnetic substance alone is not included.

Here, when a flow of electrons of the first spin S1 is set as $J_\uparrow$, a flow of electrons of the second spin S2 is set as $J_\downarrow$, and a spin current is set as $J_S$, $J_S$ is defined as $J_\uparrow - J_\downarrow$. FIG. 2, $J_S$ as the pure spin current flows in an upward direction in the drawing. Here, $J_S$ represents a flow of electrons in which polarizability is 100%.

In FIGS. 1A and 1B, when a ferromagnetic substance is brought into contact with a top surface of the spin-orbit torque wiring 2, the pure spin current is diffused and flows into the ferromagnetic substance. That is, a spin is injected into the first ferromagnetic metal layer 1.

A material of the spin-orbit torque wiring may be a material capable of generating the pure spin current, and examples thereof include a configuration including a plurality of kinds of material portions.

The material of the spin-orbit torque wiring can be a material that is selected from the group consisting of tungsten, rhenium, osmium, iridium, and alloys including at least one or more of the metals. In addition, tungsten, rhenium, osmium, and iridium have a 5d electron in the outermost shell, and have a large orbital angular momentum in a case where five orbits of a "d" orbit are in degeneracy. According to this, the spin orbit interaction that causes the spin hall effect to occur increases, and thus it is possible to efficiently generate a spin current.

The material of the spin-orbit torque wiring may include a nonmagnetic heavy metal.

Here, the heavy metal represents a metal having a specific gravity equal to or greater than the specific gravity of yttrium.

In this case, it is preferable that the nonmagnetic heavy metal is a nonmagnetic metal that has an atomic number higher than 39 and has a "d" electron or an "f" electron in the outermost shell. The reason of the preference is because in the nonmagnetic metal, the spin orbit interaction that causes the spin hall effect to occur is great. The spin-orbit torque wiring may be formed from only a nonmagnetic metal that has an atomic number of 39 or higher and has a "d" electron" or an "f" electron in the outermost shell.

Typically, when a current is allowed to flow through a metal, the entirety of electrons move in a direction opposite to a direction of the current regardless of a direction of a spin. In contrast, in the nonmagnetic metal that has a "d" electron or an "f" electron in the outermost shell and has a high atomic number, the spin orbit interaction is great, and thus a direction in which electrons move due to the spin hall effect depends on a direction of the spin of the electrons. As a result, the pure spin current is likely to occur.

When it is assumed that a low resistance portion is formed from Cu (1.7 μΩcm), examples of a material, which has an atomic number of 39 or higher and in which electrical resistivity is two or more times electrical resistivity of Cu, include Y, Zr, Nb, Mo, Ru, Pd, Cd, La, Hf, Ta, W, Re, Os, Ir, Pt, Hg, Ce, Pr, Nd, Sm, Eu, Gd, Tb, Dy, Ho, Er, Tm, Yb, and Lu.

In a case where the material of the spin-orbit torque wiring includes a nonmagnetic heavy metal, the material may include the heavy metal capable of generating the pure spin current in a limited amount. In addition, in this case, in the spin-orbit torque wiring, it is preferable that the heavy metal capable of generating the pure spin current is in a sufficiently small concentration region in comparison to a main component, or the heavy metal capable of generating the pure spin current is a main component, for example, 90% or greater. In this case of a heavy metal, it is preferable that the heavy metal capable of generating the pure spin current is composed of 100% of a nonmagnetic metal that has a "d" electron or an "f" electron in the outermost shell and an atomic number of 39 or higher.

Here, description of "the heavy metal capable of generating the pure spin current is in a sufficiently small concentration region in comparison to a main component of the spin-orbit torque wiring" represents that for example, in a spin-orbit torque wiring including copper as a main component, a concentration of the heavy metal is 10% or less in terms of a molar ratio. In a case where the main component that constitutes the spin-orbit torque wiring is composed of a material other than the above-described heavy metal, a concentration of a heavy metal that is included in the spin-orbit torque wiring is preferably 50% or less in terms of a molar ratio, and more preferably 10% or less. This concentration region is a region capable of effectively obtaining a spin scattering effect of electrons. In a case where the concentration of the heavy metal is low, a light metal having an atomic number lower than that of the heavy metal becomes a main component. Furthermore, in this case, it is assumed that the heavy metal does not form an alloy with the light metal, and atoms of the heavy metal are dispersed in the light metal in disorder. In the light metal, the spin orbit interaction is weak, and thus generation of the pure spin current due to the spin hall effect is less likely to occur. However, when electrons pass through the heavy metal in the light metal, a spin scattering effect also exists at an interface between the light metal and the heavy metal, and thus it is possible to efficiently generate the pure spin current even in a region in which the concentration of the heavy metal is low. When the concentration of the heavy metal is greater than 50%, a ratio of the spin hail effect in the heavy metal increases, but the effect of the interface between the light metal and the heavy metal decreases, and thus a total effect decreases. Accordingly, it is preferable that the heavy metal has a concentration to a certain extent capable of expecting a sufficient interface effect.

In addition, as the material of the spin-orbit torque wiring, a magnetic metal may also be included. The magnetic metal represents a ferromagnetic metal or an antiferromagnetic metal. The reason for this is because when a slight amount of magnetic metal is included in the nonmagnetic metal, the spin orbit interaction is enhanced, and thus it is possible to raise spin current generation efficiency with respect to a current that is allowed to flow to the spin-orbit torque wiring. The spin-orbit torque wiring may be formed from only the antiferromagnetic metal. The antiferromagnetic metal can obtain approximately the same effect as in a case where the heavy metal is composed of 100% of a nonmagnetic metal that has a "d" electron or an "f" electron in the outermost shell and has an atomic number of 39 or higher. As the antiferromagnetic metal, for example, IrMn and PtMn are preferable, and IrMn that is stable against heat is more preferable.

The spin orbit interaction occurs due to a substance specific to an internal field of a spin-orbit torque wiring material, and thus the pure spin current also occurs in a nonmagnetic material. When a slight amount of a magnetic metal is added to the spin-orbit torque wiring material, the magnetic metal scatters an electron spin that flows, and thus spin current generation efficiency is improved. However, the amount of the magnetic metal added too increases, the pure spin current that is generated is scattered by the magnetic metal that is added, and as a result, an operation of reducing the spin current becomes strong. Accordingly, it is preferable that a molar ratio of the magnetic metal that is added is sufficiently smaller than a molar ratio of a main component of the spin-orbit torque wiring. That is, it is preferable that the molar ratio of the magnetic metal that is added is 3% or less.

In addition, the spin-orbit torque wiring may include a topological insulator. The spin-orbit torque wiring may be composed of only the topological insulator. The topological insulator is a substance of which the inside is an insulator or a high-resistance substance, but a spin-polarized metal state occurs on a surface thereof. In the substance, spin orbit interaction similar to an internal magnetic field exists. Accordingly, even though an external magnetic field does not exist, a new topological phase is exhibited due to an effect of the spin orbit interaction. This phase is the topological insulator, and it is possible to generate the pure spin current with high efficiency due to strong spin orbit interaction and collapse of reversal symmetry at an edge.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, and the like are preferable. The topological insulators can generate a spin current with high efficiency.

In the spin current magnetization rotational element of the embodiment, a current (SOT reversal current) that is allowed to flow to the spin-orbit torque wiring so as to use the SOT effect is a typical current that is accompanied with a flow of charges, and thus when the current is allowed to flow, Joule's heat is generated.

Here, a heavy metal that is a material that is likely to generate the pure spin current has electrical resistivity higher than that of a metal that is used as a typical wiring.

According to this, it is preferable that the spin-orbit torque includes a portion having low electrical resistivity in comparison to a case where the entirety of the spin-orbit torque wiring is formed from a material capable of generating the pure spin current from the viewpoint of reducing the Joule's heat due to the SOT reversal current. In this regard, the spin-orbit torque wiring that is provided in the spin current magnetization rotational element of the embodiment may include a portion (pure spin current generating portion) that is formed from a material that generate the pure spin current, and a portion (low-resistance portion) that is formed from a material having electrical resistivity lower than that of the pure spin current generating portion.

In this case, as a material of the pure spin current generating portion, materials which are described above as the material of the spin-orbit torque wiring can be used, and as a material of the low-resistance portion, a material that is used as a typical wiring can be used. For example, aluminum, silver, copper, gold, and the like can be used. The low-resistance portion may be composed of a material having electrical resistivity lower than that of the pure spin current generating portion, and for example, a configuration composed of a plurality of kinds of material portions and the like are possible.

Furthermore, the pure spin current may be generated at the low-resistance portion. In this case, with regard to discrimination between the pure spin current generating portion and the low-resistance portion, portions composed of materials, which are described as materials of the pure spin current generating portion and the low-resistance portion in this specification, may be noted as the pure spin current generating portion or the low-resistance portion for discrimination. In addition, as a portion other than a main portion that generates the pure spin current, a portion having electrical resistivity lower than that of the main portion may be noted as the low-resistance portion for discrimination from the pure spin current generating portion.

In the embodiment, description has been given of a case where the spin-orbit torque wiring is directly connected to the first ferromagnetic metal layer. However, as to be described later, another layer such as a cap layer may be interposed between the first ferromagnetic metal layer and the spin-orbit torque wiring. Details of the cap layer will be described in relation to a cap layer 104 in an application of the magnetoresistance effect element.

First Ferromagnetic Metal Layer

The first ferromagnetic metal layer 1 shown in FIGS. 1A and 1B has a lamination structure including three ferromagnetic constituent layers 1Aa, 1Ab, and 1Ac, the nonmagnetic constituent layer 1Ba that is interposed between the ferromagnetic constituent layers 1Aa and 1Ab adjacent to each other, and the nonmagnetic constituent layer 1Bb that is interposed between the ferromagnetic constituent layers 1Ab and 1Ac adjacent to each other. However, the first ferromagnetic metal layer may have a configuration, in which among the plurality of ferromagnetic constituent layers, at least one ferromagnetic constituent layer has a film thickness different from that of the other ferromagnetic constituent layers, a configuration in which among the plurality of nonmagnetic constituent layers, at least one nonmagnetic constituent layer has a film thickness different from that of the other nonmagnetic constituent layers, or a configuration in which at least one ferromagnetic constituent layer has a film thickness different from that of the other ferromagnetic constituent layers, and at least one nonmagnetic constituent layer has a film thickness different from that of the other nonmagnetic constituent layers.

In the spin current magnetization rotational element of the embodiment, it is preferable that film thicknesses of two ferromagnetic constituent layers between which one nonmagnetic constituent layer among the plurality of nonmagnetic constituent layers constituting the first ferromagnetic metal layer is interposed, is different from each other, or film thicknesses of two nonmagnetic constituent layers, between which one ferromagnetic constituent layer among the plurality of ferromagnetic constituent layers constituting the first ferromagnetic metal layer is interposed, is different from each other.

Furthermore, in a case where consideration is made only to the pure spin current due to the spin hall effect, the film thicknesses of the nonmagnetic constituent layers may be made to be different from each other, but the magnitude of the interface rashba effect depends on the film thickness of the ferromagnetic constituent layers. Accordingly, in a configuration in which the film thicknesses of the ferromagnetic constituent layers are made to be different from each other, it is also possible to increase the pure spin current.

Ferromagnetic Constituent Layer

As a material of the ferromagnetic constituent layers 1Aa, 1Ab, and 1Ac which constitute the first ferromagnetic metal layer 1, a ferromagnetic material, particularly, a soft-magnetic material, can be used. For example, a metal selected from the group consisting of Cr, Mn, Cd, Fe, and Ni, an alloy that includes one or more kinds of the metals, an alloy that includes the metals and at least one or more elements among B, C, and N, and the like can be used. Specific examples thereof include Co—Fe, Co—Fe—B, and Ni—Fe.

In a case where a magnetization direction of the ferromagnetic constituent layers 1Aa, 1Ab, and 1Ac is set to be orthogonal to a lamination surface, it is preferable that the film thickness of each of the ferromagnetic constituent layers is set to be 1.5 nm or less. At an interface between the ferromagnetic constituent layers and the nonmagnetic constituent layers, it is possible to apply orthogonal magnetic anisotropy (interface-orthogonal magnetic anisotropy) to the ferromagnetic constituent layers. In addition, when the film thickness of the ferromagnetic constituent layers is set to be large, an effect of the interface orthogonal magnetic anisotropy is attenuated, and thus it is preferable that the film thickness of the ferromagnetic constituent layer is set to be small.

It is preferable that the film thickness of each of the ferromagnetic constituent layer is set to be 1.0 nm or less. The reversal current density due to SOT is proportional to the film thickness of the ferromagnetic metal layer, and thus it is possible to reduce the reversal current density while maintaining relatively strong interface-orthogonal magnetic anisotropy.

In the spin current magnetization rotational element of the disclosure, it is preferable that among the plurality of ferromagnetic constituent layers, a ferromagnetic constituent layer that is closest to the spin-orbit torque wiring is thinner than the other ferromagnetic constituent layers.

When the ferromagnetic constituent layer that is closest to the spin-orbit torque wiring is made to be thin, it is possible to increase the interface-orthogonal magnetic anisotropy that acts between the spin-orbit torque wiring and the ferromagnetic constituent layer, and thus it is possible to realize a relatively strong orthogonal magnetization film.

In the spin current magnetization rotational element of the disclosure, any one ferromagnetic constituent layer among the plurality of ferromagnetic constituent layers may include a dead layer.

Here, the dead layer represents a region in a state in which elements are mixed at the interface between the nonmagnetic constituent layer and the spin-orbit torque wiring, and thus magnetization is not present.

When the ferromagnetic constituent layer includes the dead layer, an effective film thickness of the ferromagnetic constituent layer is changed from a design value, and as a result, it is possible to change the degree of asymmetry of the lamination structure.

Furthermore, presence of the dead layer can be confirmed as follows. That is, when reducing the film thickness of the ferromagnetic constituent layer with respect to magnetization, a portion corresponding to a film thickness that remains when the magnetization becomes zero is confirmed as the dead layer.

In the spin current Magnetization rotational element of the embodiment, it is preferable that as the first ferromagnetic metal layer is closer to the spin-orbit torque wiring, a cross-sectional area of a cross-section orthogonal to the first direction (plane-orthogonal direction) is enlarged.

When the first ferromagnetic metal layer is cut along a plane orthogonal to the plane-orthogonal direction, if a cross-sectional area is larger at a portion that is close to the spin-orbit torque wiring, resistance becomes lower in comparison to an element having a configuration in which the cross-sectional area is the same in the plane-orthogonal direction, and thus a current is likely to invade into the first ferromagnetic metal layer.

Nonmagnetic Constituent Layer

The nonmagnetic constituent layers 1Ba and 1Bb are layers (spin current generating layers) which generate a spin current.

Accordingly, as a material of the nonmagnetic constituent layers 1Ba and 1Bb, materials which are described above as the material of the spin-orbit torque wiring can be used.

It is preferable that the film thickness of each of the nonmagnetic constituent layers is set to 0.3 to 2.0 nm. When the film thickness is smaller than 0.3 nm, the film thickness becomes a film thickness when cutting one atomic layer, and thus there is a concern that interface-orthogonal magnetic anisotropy may not be caused. When the film thickness is larger than 2.0 nm, there is a concern that magnetic bonding between the ferromagnetic constituent layers is broken, and thus the first ferromagnetic metal layer may not function as one ferromagnetic metal layer.

In the spin current magnetization rotational element of the embodiment, among the plurality of nonmagnetic constituent layers, a nonmagnetic constituent layer that is closest to the spin-orbit torque wiring may be thinner than the other nonmagnetic constituent layers.

A current flows most strongly in the nonmagnetic constituent layer closest to the spin-orbit torque wiring. Accordingly, when the nonmagnetic constituent layer is the thinnest, an effect of generating the pure spin current due to the spin hall effect can be exhibited the most.

Furthermore, the effect depends on resistivity of the nonmagnetic constituent layers. It is preferable that a material of the nonmagnetic constituent layer have a resistivity lower than the resistivity of a material of the ferromagnetic constituent layers. For example, in a case where the material of the ferromagnetic constituent layers is Fe, resistivity is 8.9 $\mu\Omega\cdot cm$. Accordingly, examples of a preferred material of the nonmagnetic constituent layers include W (4.9 $\mu\Omega\cdot cm$), Ag (1.47 μΩ·cm), (2.05 μΩ·cm), Ir (4.7 μΩ·cm), Os (8.1 μΩ·cm), Mo (5 μΩ·cm), Rh (4.3 μΩ·cm), and the like.

With regard to the plurality of nonmagnetic constituent layers, it is considered that the magnitude of a current that flows to the nonmagnetic constituent layers is different in accordance with a distance from the spin-orbit torque wiring, but it is difficult to estimate the dependency at this point of time. Accordingly, it is preferable to optimize a combination of the film thicknesses of the nonmagnetic constituent layers by measuring the Magnitude of magnetization rotation. This is also true of the plurality of ferromagnetic constituent layers.

In the spin current magnetization rotational element of the embodiment, among the plurality of nonmagnetic constituent layers, a material of at least one nonmagnetic constituent layer may be different from a material of the other nonmagnetic constituent layers.

In a configuration of different kinds of materials, it is possible to obtain an asymmetric lamination structure, and thus it is possible to maximize the SOT effect.

In the spin t magnetization rotational element of the embodiment, it is preferable that the nonmagnetic constituent layers are formed from a material that applies interface-orthogonal magnetic anisotropy to the ferromagnetic constituent layers.

When using the material having the interface-orthogonal magnetic anisotropy, it is possible to improve the orthogonal magnetic anisotropy of the first ferromagnetic metal layer. In the lamination structure, an orthogonal magnetization film is obtained, and thus it is possible to apply the degree of integration in a case of MRAM.

Operation Principle

The operation principle of the spin current magnetization rotational element of the embodiment will be described with reference to FIGS. 1A and 1B.

The first ferromagnetic metal layer is formed from a metal, and thus when currents flow to the spin-orbit torque wiring, the current also invades into the first ferromagnetic metal layer. Parts of the currents which invade into the first ferromagnetic metal layer also flow to the nonmagnetic constituent layers 1Ba and 1Bb (Ia and Ib). When the currents flow to the nonmagnetic constituent layers 1Ba and 1Bb, an electron of upward spin and an electron of downward spin are curved in directions opposite to each other due to the spin hall effect, and thus the pure spin current can be generated.

Figure 3:
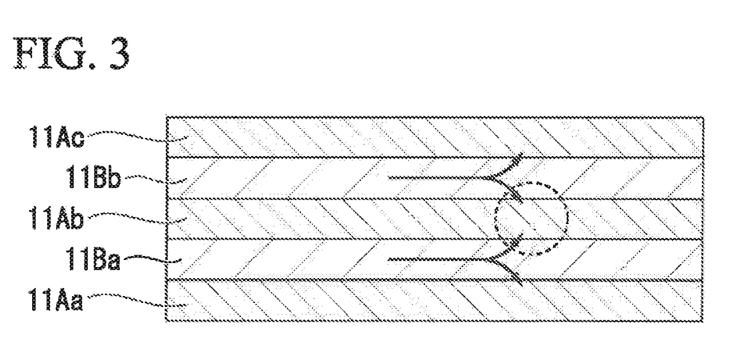
FIG. 3 is a schematic view showing an operation principle of the disclosure.

FIG. 3 is a view schematically showing movement of a spin due to the spin hall effect in a case where the same current flows to two nonmagnetic constituent layers 11Ba and 11Bb in a lamination structure including three ferromagnetic constituent layers 11Aa, 11Ab, and 11Ac which are formed from the same material and have the same film thickness, and the two nonmagnetic constituent layers 11Ba and 11Bb which are formed from the same material and have the same film thickness.

In the lamination structure including a plurality of ferromagnetic constituent layers which are formed from the same material and have the same film thickness, and a plurality of nonmagnetic constituent layers which are formed from the same material and have the same film thickness (hereinafter, the lamination structure may be referred to as "symmetric lamination structure"), spin currents in directions opposite to each other meet in the vicinity of a portion indicated by a dotted-line circle, and spin currents are canceled. As a result, the pure spin current is not generated, or the pure spin current becomes weak.

A lamination structure of [ferromagnetic layer/nonmagnetic layer]$_n$ is a configuration that is used as a method of generating orthogonal magnetic anisotropy in the related art, but a symmetric lamination structure is assumed. Accordingly, it is recognized that the pure spin current is not generated as a result of cancelation.

The present inventors collapses "symmetric lamination structure" (that is, employs "asymmetric lamination structure") so that spin currents in directions opposite to other are not canceled so as to generate the pure spin current, and uses the pure spin current in magnetization rotation. The "asymmetric lamination structure" represents a configuration in Which film thicknesses are set to be different from each other in order for the spin currents in directions opposite to each other not to be canceled. The "asymmetric lamination structure" may be realized by employing materials different from each other, or may be realized by a combination of materials different from each other and film thicknesses different from each other.

The spin current magnetization rotational element 10 shown FIGS. 1A and 1B employs a configuration in which the nonmagnetic constituent layer 1Ba has a film thickness larger than that of the nonmagnetic constituent layer 1Bb, and thus spin currents in directions opposite to each other are not canceled, and thus a pure spin current $Js_2$ is generated. In addition, the three ferromagnetic constituent layers have the same film thickness.

In the spin current magnetization rotational element 10, magnetization rotation of the ferromagnetic constituent layers is performed by a pure spin current $Js_1$ that is generated in the spin-orbit torque wiring and the pure spin current $Js_2$ that is generated in the first ferromagnetic metal layer. The pure spin current $Js_1$ and the pure spin current $Js_2$ also include a pure spin current based on the interface rashba effect.

FIGS. 4A to 4D are schematic cross-sectional views of a first ferromagnetic metal layer in another example of the spin current magnetization rotational element of the embodiment. It is assumed that the spin-orbit torque wiring is disposed on a lower side of the drawings.

The first ferromagnetic metal layer shown in FIGS. 4A to 4D corresponds to a case of a lamination structure including three ferromagnetic constituent layers and two nonmagnetic constituent layers. For example, in a case where the ferromagnetic constituent layers are formed from Co, and the nonmagnetic constituent layers are formed from Pt, the lamination structure corresponds to a case of [Co/Pt]$_2$/Co.

Figure 4A:
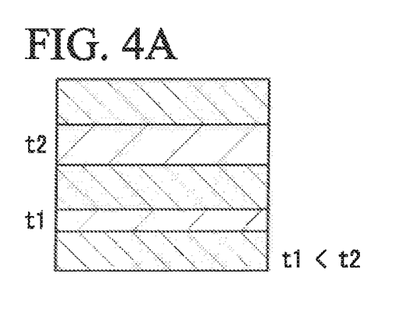
FIGS. 4A to 4D are schematic cross-sectional views of a first ferromagnetic metal layer in another example of the spin current magnetization rotational element of the disclosure.

FIG. 4A shows an example of a case where the three ferromagnetic constituent layers have the same film thickness, and the two nonmagnetic constituent layers have film thicknesses different from each other. Differently from the example in FIGS. 1A to 1B, FIG. 4A corresponds to a case where between the nonmagnetic constituent layers, the film thickness of a nonmagnetic constituent layer that is far away from the spin-orbit torque wiring is larger than the film thickness of a nonmagnetic constituent layer that is closer to the spin-orbit torque wiring. In FIGS. 4A to 4D, t1, t2, and t3 represent thicknesses of the respective layers.

Figure 4B:
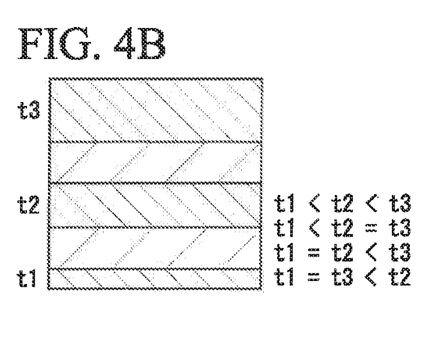
Figure 4C:
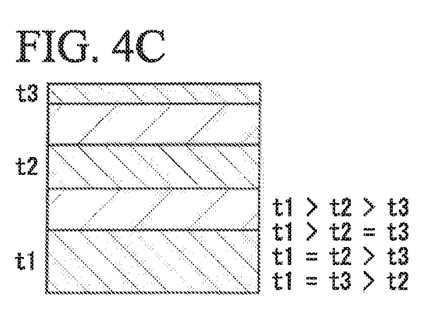
Figure 4D:
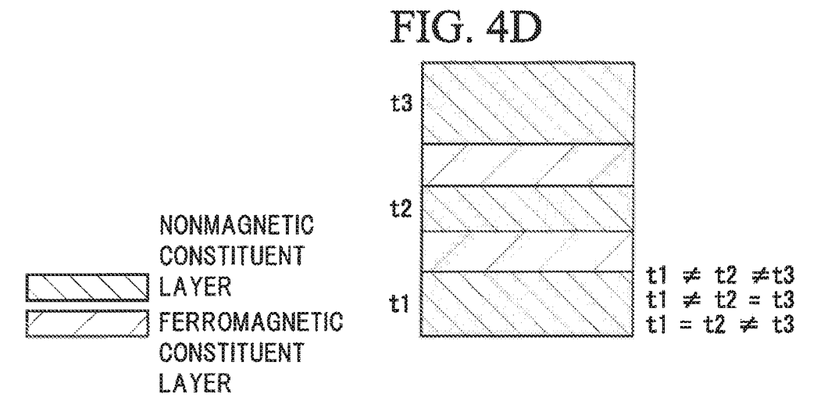

FIGS. 4B to 4D are examples of a case where the two nonmagnetic constituent layers have the same film thickness, and the three ferromagnetic constituent layers have film thicknesses different from each other.

A configuration of FIG. 4B is an example in which the film thickness gradually becomes smaller as it goes from the uppermost layer to the lowest layer. In film-thickness magnitude relationship described on a right side in FIG. 4B, the uppermost magnitude relationship corresponds to FIG. 4B, and the other three magnitude relationships correspond to modification examples of FIG. 4B.

A configuration of FIG. 4C is an example in which the film thickness gradually becomes larger as it goes from the uppermost layer to the lowest layer. Among film-thickness magnitude relationships described on a right side in FIG. 4C, the uppermost magnitude relationship corresponds to FIG. 4C, and the other three magnitude relationships correspond to modification examples of FIG. 4C.

A configuration of FIG. 4I) is an example in which arrangement of the film thickness does not follow a large film thickness order or a small film thickness order. Among film-thickness relationships described on a right side in FIG. 4D, the uppermost relationship corresponds to FIG. 4D, and the other two relationships correspond to modification examples of FIG. 4D.

FIGS. 5A to 5F are schematic cross-sectionals views of a first ferromagnetic metal layer in still another example of the spin current magnetization rotational element of the embodiment. It is assumed that the spin-orbit torque wiring is disposed on a lower side in the drawings.

The first ferromagnetic metal layer shown in FIGS. 5A to 5F corresponds to a case of a lamination structure including four ferromagnetic constituent layers and three nonmagnetic constituent layers. For example, in a case Where the ferromagnetic constituent layers are formed from Co, and the nonmagnetic constituent layers are formed from Pt, the lamination structure corresponds to a case of $[Co/Pt]_3/Co$.

Figure 5A:
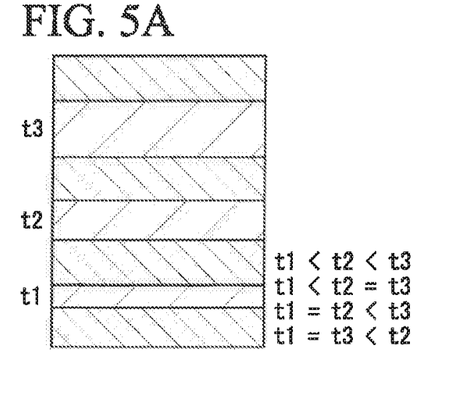
FIGS. 5A to 5F are schematic cross-sectional views of a first ferromagnetic metal layer in still another example of the spin current magnetization rotational element of the disclosure.
Figure 5B:
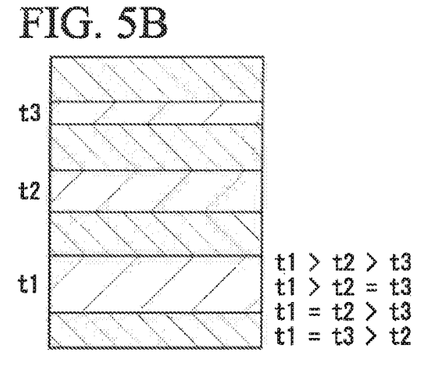
Figure 5C:
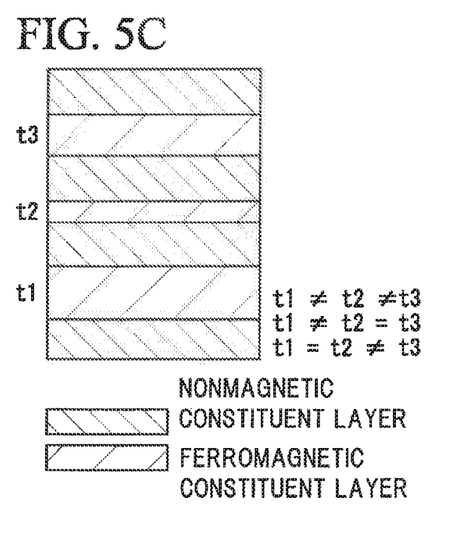

FIGS. 5A to 5C correspond to a case where the four ferromagnetic constituent layers has the same film thickness.

FIG. 5A shows an example in which the film thickness of the three nonmagnetic constituent layers gradually becomes smaller as it goes from the uppermost layer to the lowest layer. Among film-thickness magnitude relationships described on a right side in FIG. 5A, the uppermost magnitude relationship corresponds to FIG. 5A, and the other three magnitude relationships correspond to modification examples of FIG. 5A.

A configuration of FIG. 5B is an example in which the film thickness gradually becomes larger as it goes from the uppermost layer to the lowest layer. Among film-thickness magnitude relationships described on a side in FIG. 5B, the uppermost magnitude relationship corresponds to FIG. 5B, and the other three magnitude relationships correspond to modification examples of FIG. 5B.

A configuration of FIG. 5C is an example in which arrangement of the film thickness does not follow a large film thickness order or a small film thickness order. Among film-thickness relationships described on a right side in FIG. 5C, the uppermost relationship corresponds to FIG. 5C, and the other two relationships correspond to modification examples of FIG. 5C.

Figure 5D:
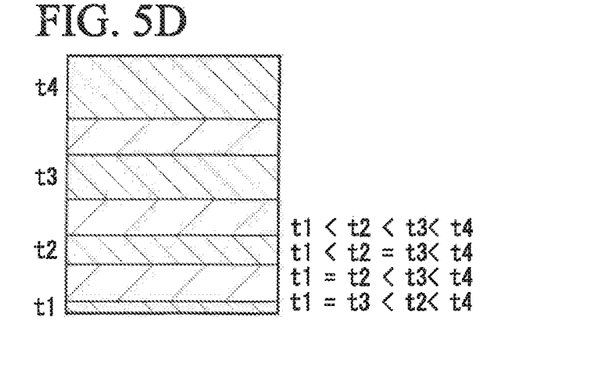
Figure 5E:
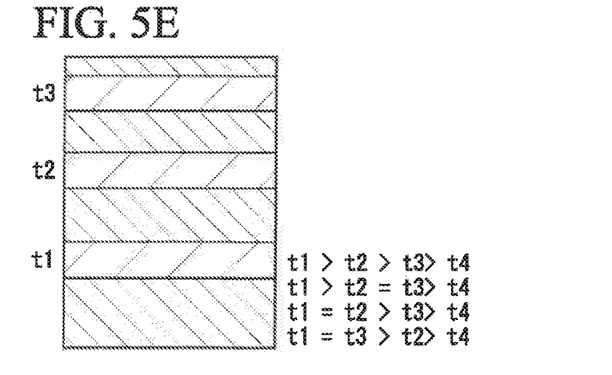
Figure 5F:
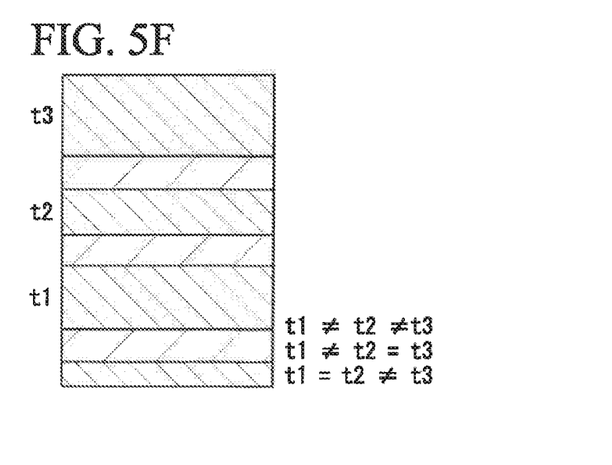

FIGS. 5D to 5F correspond to a ease where the three nonmagnetic constituent layers have the same film thickness.

FIG. 5D shows an example in which the film thickness of the four ferromagnetic constituent layers gradually becomes smaller as it goes from the uppermost layer to the lowest layer. Among film-thickness magnitude relationships described on a right side in FIG. 5D, the uppermost magnitude relationship corresponds to FIG. 5D, and the other three magnitude relationships correspond to modification examples of FIG. 5D.

A configuration of FIG. 5E is an example in which the film thickness gradually becomes larger as it goes from the uppermost layer to the lowest layer. In film-thickness magnitude relationship described on a right side in FIG. 5E, the uppermost magnitude relationship corresponds to FIG. 5E, and the other three magnitude relationships correspond to modification examples of FIG. 5E.

A configuration of FIG. 5F is an example in which arrangement of the film thickness does not follow a large film thickness order or a small film thickness order. Among film-thickness relationships described on a right side in FIG. 5F, the uppermost relationship corresponds to FIG. 5F, and the other two relationships correspond to modification examples of FIG. 5F.

In the spin current magnetization rotational element of the embodiment, with respect to an average film thickness (simple average film thickness) of the plurality of ferromagnetic constituent layers, the film thickness of each of the ferromagnetic constituent layers may be different from the average film thickness by ±10% or more, or with respect to an average film thickness of the plurality of nonmagnetic constituent layers, a film thickness of each of the nonmagnetic constituent layers may be different from the average film thickness of the nonmagnetic constituent layers by ±10% or more.

In layers having film thicknesses different from each other, when each of the film thicknesses is different from the average film thickness by 10% or more, an effect is further enhanced.

In the spin current magnetization rotational element of the embodiment, sheet resistance of the first ferromagnetic metal layer may be smaller than sheet resistance of the spin-orbit torque wiring.

When the sheet resistance of the first ferromagnetic metal layer is smaller than the sheet resistance of the spin-orbit torque wiring, a current is likely to invade into the first ferromagnetic metal layer.

It is preferable that a material of the ferromagnetic constituent layers is selected from ferromagnetic metals including any one of Fe, Co, and Ni, and a material of the nonmagnetic constituent layers is selected from nonmagnetic metals including any one of Ti, Cr, Cu, Mo, Ru, Rh, Pd, Ag, Hf, Ta, W, Ir, Pt, Au, and Bi.

It is preferable that a ratio of a length of the first ferromagnetic metal layer along the second direction to the thickness of the first ferromagnetic metal layer is 1 or greater, more preferably 5 or greater, and still more preferably 10 or greater.

Among currents, which invade into the first ferromagnetic metal layer from the spin-orbit torque wiring, in a current that goes around far away from the spin-orbit torque wiring, resistance further increases. However, as the ratio of the length of the first ferromagnetic metal layer to the thickness of the first ferromagnetic metal layer increases, it is possible to suppress an influence on an increase in resistance due to detouring.

As to be described later, the spin current magnetization rotational element of the embodiment is applicable to a magnetoresistance effect element. The use is not limited to the magnetoresistance effect element, and application to another use is also possible. With regard to the other use, for example, the spin current magnetization rotational element may be used in a spatial optical modulator in which the spin current magnetization rotational element is arranged in respective pixels to spatially modulate incident light by using a magneto-optical effect. In addition, a magnetic field, which is applied to an axis of easy magnetization of a magnet to avoid a hysteresis effect due to coercivity of the magnet in a magnetic sensor, may be substituted with SOT.

Magnetoresistance Effect Element

A magnetoresistance effect element according an embodiment of the disclosure includes the spin current magnetization rotational element of the embodiment, a second ferromagnetic metal layer in which a magnetization direction is fixed, and a nonmagnetic layer that is interposed between the first ferromagnetic metal layer and the second ferromagnetic metal layer.

Here, fixing of the magnetization direction represents that a magnetization direction does not vary (magnetization is fixed) before and after recoding by using a recording current.

It is preferable that among a plurality of ferromagnetic constituent layers of the first ferromagnetic metal layer, the film thickness of a ferromagnetic constituent layer that is in contact with the nonmagnetic layer is smallest.

The reason for this is that the interface-orthogonal magnetic anisotropy, which acts on between the nonmagnetic layers and the ferromagnetic constituent layers, can be maximized.

Figure 6:
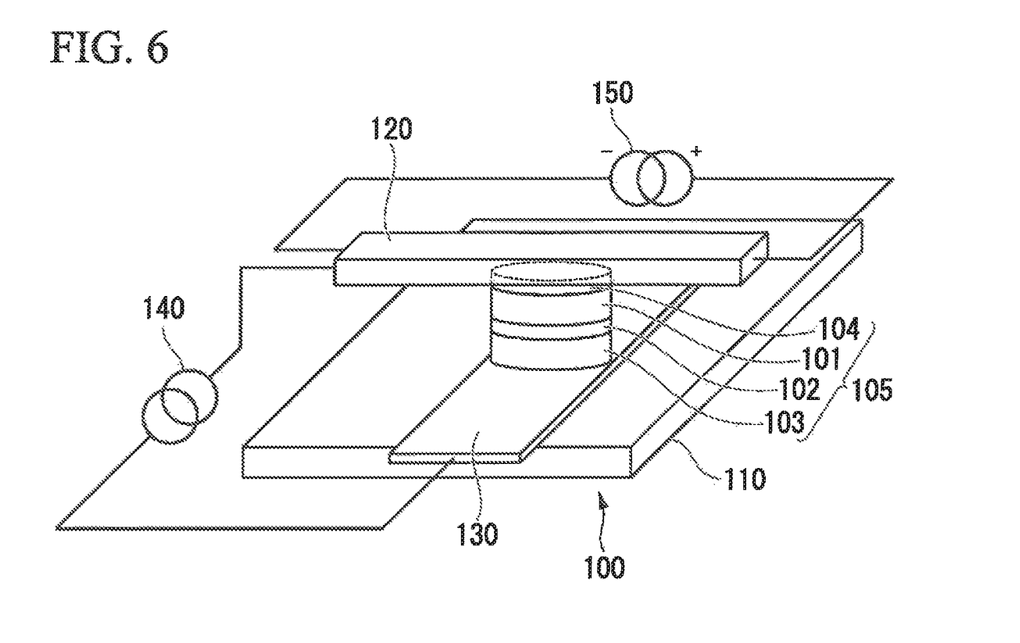
FIG. 6 is a perspective view schematically showing a magnetoresistance effect element that is an application example of the spin current magnetization rotational element of the disclosure and is also a magnetoresistance effect element according to an embodiment of the disclosure.

FIG. 6 is an application example of the spin current magnetization rotational element of the embodiment, and is a perspective view schematically showing a magnetoresistance effect element that is also the magnetoresistance effect element according to an embodiment of the disclosure. Furthermore, in FIG. 6, characteristic portions of the spin current magnetization rotational element of the embodiment are not shown.

A magnetoresistance effect element 100 shown in FIG. 6 includes the spin current magnetization rotational element (a first ferromagnetic metal layer 101 and a spin-orbit torque wiring 120) of the embodiment, a second ferromagnetic metal layer 103 in which a magnetization direction is fixed, and a nonmagnetic layer 102 that is interposed between the first ferromagnetic metal layer 101 and the second ferromagnetic metal layer 103. The first ferromagnetic metal layer 101 has the same configuration as in the first ferromagnetic metal layer 1, and the spin-orbit torque wiring 120 has the same configuration as in the spin-orbit torque wiring 2. In addition, it can be said that the magnetoresistance effect element 100 shown in FIG. 6 includes a magnetoresistance effect element part 105 and the spin-orbit torque wiring 120.

The magnetoresistance effect element according to an embodiment of the embodiment may have a configuration in which magnetization reversal of the magnetoresistance effect element is performed with SOT alone due to the pure spin current (hereinafter, may be referred to as "SOT-alone" configuration), or a configuration in which in the magnetoresistance effect element using STT in the related art, SOT due to the pure spin current is used in combination.

In the following description including FIG. 6, as an example of a configuration in which the spin-orbit torque wiring extends in a direction intersecting a lamination direction of the magnetoresistance effect element part, description will be given of a case of a configuration extending in an orthogonal direction.

In FIG. 6, a wiring 130 through which a current flows in the lamination direction of the magnetoresistance effect element 100, and a substrate 110 that forms the wiring 130 are also shown. In addition, a cap layer 104 is provided between the first ferromagnetic metal layer 101 and the spin-orbit torque wiring 120.

Magnetoresistance Effect Element Part

The magnetoresistance effect element part 105 includes the second ferromagnetic metal layer 103 in which a magnetization direction is fixed, the first ferromagnetic metal layer 101 in which a magnetization direction varies, and the nonmagnetic layer 102 that is interposed between the second ferromagnetic metal layer 103 and the first ferromagnetic metal layer 101.

Since magnetization of the second ferromagnetic metal layer 103 is fixed in one direction, and the magnetization direction of the first ferromagnetic metal layer 101 relatively varies, a function as the magnetoresistance effect element part 105 is also possible. In an application to coercivity difference type (pseudo spin valve type) MRAM, coercivity of the second ferromagnetic metal layer is greater than coercivity of the first ferromagnetic metal layer, and in an application to an exchange bias type (spin valve type) MRAM, in the second ferromagnetic metal layer, the magnetization direction is fixed due to exchange coupling with an antiferromagnetic layer.

In addition, in a case where the nonmagnetic layer 102 is formed from an insulator, the magnetoresistance effect element part 105 is a tunneling magnetoresistive element (TMR) element, and in a case where the nonmagnetic layer 102 is formed from a metal, the magnetoresistance effect element part 105 is a giant magnetoresistive (GMR) element.

With regard to the magnetoresistance effect element part that is provided in the embodiment, a configuration of a magnetoresistance effect element part of the related art can be used. For example, each layer may include a plurality of layers, or another layer such as an antiferromagnetic layer configured to fix the magnetization direction of the second ferromagnetic metal layer may be provided.

The second ferromagnetic metal layer 103 and the first ferromagnetic metal layer 101 may be an in-plane magnetic film in which the magnetization direction is an in-plane direction parallel to a layer, or an orthogonal magnetic film in which the magnetization direction is a direction orthogonal to a layer.

As a material of the second ferromagnetic metal layer 103, a known material can be used. For example, a metal that is selected from the group consisting of Cr, Mn, Co, Fe, and Ni, and alloys which include one or more kinds of the metals and exhibit ferromagnetism can be used. In addition, alloys which include the metals, and at least one or more kinds of elements among B, C, and N, can be used. Specific examples thereof include Co—Fe, and Co—Fe—B.

In addition, it is preferable to use a Heusler alloy such as $Co_2FeSi$ to obtain a relatively higher output. The Heusler alloy includes an intermetallic compound having a chemical composition of $X_2YZ$. Here, X represents a transition metal element or a noble metal element of a group of Co, Fe, Ni, or Cu in a periodic table, Y represents a transition metal of a group of Mn, V, Cr, or Ti and can also employ element species of X, and Z is a typical element of a group III to a group V. Examples of the Heusler alloy include $Co_2FeSi$, $Co_2MnSi$, $Co_2Mn_{1-a}Fe_aAl_bSi_{1-b}$, and the like.

In addition, to further increase coercivity with respect to the first ferromagnetic metal layer 101 of the second ferromagnetic metal layer 103, as a layer (pinning layer) that is in contact with the second ferromagnetic metal layer 103 on a surface opposite to a surface that is in contact with the nonmagnetic layer 102, a layer of an antiferromagnetic material such as IrMn and PtMn may be used. In addition, it is possible to employ a synthetic ferromagnetic coupling structure so that a leakage magnetic field of the second ferromagnetic metal layer 103 does not have an effect on the first ferromagnetic metal layer 101.

In addition, in a case where the magnetization direction of the second ferromagnetic metal layer 103 is set to orthogonal to a lamination surface, it is preferable to use a laminated film of Co and Pt. Specifically, the second ferromagnetic metal layer 103 may be set to [Co (0.24 nm)/Pt (0.16 nm)]6/Ru (0.9 nm)/[Pt (0.16 nm)/Co (0.16 nm)]4/Ta (0.2 nm)/FeB (1.0 nm).

A known material can be used for the nonmagnetic layer 102. For example, in a case where the nonmagnetic layer 102 is formed from an insulator (that is, in a case of a tunnel barrier layer), as a material thereof. $Al_2O_3$, $SiO_2$, Mg, and $MgAl_2O_4$ and the like can be used. In addition, in addition to these materials, materials in which a part of Al, Si, and Mg is substituted with Zn, Be, and the like, and the like can be used. Among these, MgO or $MgAl_2O_4$ is a material capable of realizing a coherent tunnel, and thus it is possible to efficiently inject a spin. In addition, in a case where the nonmagnetic layer 102 is formed from a metal, as a material thereof, Cu, Au, Ag, and the like can be used.

In addition, it is preferable that the cap layer 104 is formed on a surface opposite to the nonmagnetic layer 102 of the first ferromagnetic metal layer 101 as shown in FIG. 6. The cap layer 104 can suppress diffusion of elements from the first ferromagnetic metal layer 101. In addition, the cap layer 104 also contributes to a crystal orientation of each layer of the magnetoresistance effect element part 105. As a result, when the cap layer 104 is provided, magnetism of the second ferromagnetic metal layer 103 and the first ferromagnetic metal layer 101 of the magnetoresistance effect element part 105 is stabilized, and thus it is possible to realize a reduction in resistance of the magnetoresistance effect element part 105.

In the cap layer 104, a high-conductivity material is preferably used. For example, Ru, Ta, Cu, Ag, Au, and the like can be used. It is preferable that a crystal structure of the cap layer 104 is appropriately set to a face centered cubic (fcc) structure, a hexagonal closest packing (hcp) structure, or a body centered cubic (bcc) structure in accordance with a crystal structure of the ferromagnetic metal layer that is adjacent to the cap layer 104.

In addition, it is preferable to use any one selected from the group consisting of Ag, Cu, Mg, and Al in the cap layer 104. Although details will be described later, in a case where the spin-orbit torque wiring 120 and the magnetoresistance effect element part. 105 are connected through the cap layer 104, it is preferable that the cap layer 104 does not scatter a spin that propagates from the spin-orbit torque wiring 120. It is known that silver, copper, magnesium, aluminum, and the like has a spin diffusion length as long as 100 nm or greater, and thus the spin is less likely to be scattered.

It is preferable that the thickness of the cap layer 104 is equal to or less than a spin diffusion length of a material that constitutes the cap layer 104. When the thickness of the cap layer 104 is equal to or less than the spin diffusion length, it is possible to sufficiently transfer the spin that propagates from the spin-orbit torque wiring 120 to the magnetoresistance effect element part 105.

Substrate

It is preferable that the substrate 110 is excellent in flatness. To obtain a surface with excellent flatness, it is possible to use a material, for example, Si, AlTiC, and the like.

An underlayer (not shown) may be formed on a surface of the substrate 110 on the magnetoresistance effect element part 105 side. When the underlayer is provided, it is possible to control crystallinity such as a crystal orientation and a crystal grain size of respective layers including the second ferromagnetic metal layer 103 that is laminated on the substrate 110.

It is preferable that the underlayer has an insulating property in order for a current flowing to a wiring 130 and the like not to be scattered. As the underlayer, various layers can be used. For example, as one example, a nitride layer, which has a (001)-oriented NaCl structure and includes at least one element selected from the group consisting of Ti, Zr, Nb, V, Hf, Ta, Mo, W, B, Al, and Ce, can be used in the underlayer.

As another example, it is possible to use a (002)-oriented perovskite-based conductive oxide layer expressed by a composition formula of $XYO_3$ can be used in the underlayer. Here, a site X includes at least one element selected from the group consisting of Sr, Ce, Dy, La, K, Ca, Na, Pb, and Ba, and a site Y includes at least one element that is selected from the group consisting of Ti, V, Cr, Mn, Fe, Co, Ni, Ga, Nb, Mo, Ru, Ir, Ta, Ce, and Pb.

As still another example, it is possible to use an oxide layer that has a (001)-oriented NaCl structure and includes at least one element selected from the group consisting of Mg, Al, and Ce in the underlayer.

As still another example, it is possible to use a layer that has a (001)-oriented tetragonal structure or cubic structure, and includes at least one element selected from the group consisting of Al, Cr, Fe, Co, Rh, Pd, Ag, Ir, Pt, Au, Mo, and W as the underlayer.

In addition, the underlayer is not limited to a monolayer, and a plurality of layers in the examples may be laminated. Through examination of a configuration of the underlayer, it is possible to enhance crystallinity of each layer of the magnetoresistance effect element part 105, and thus it is possible to improve magnetic characteristics.

Wiring

The wiring 130 is electrically connected to the second ferromagnetic metal layer 103 of the magnetoresistance effect element part 105, and in FIG. 6, the wiring 130, the spin-orbit torque wiring 120, and a power supply (not shown) constitute a closed circuit, and thus a current flows in a lamination direction of the magnetoresistance effect element part 105.

A material of the wiring 130 is not particularly limited as long as the material has high conductivity. For example, aluminum, silver, copper, gold, and the like can be used.

In the embodiment, description has been given of an example of a so-called bottom pin structure in which in the magnetoresistance effect element 100, the first ferromagnetic metal layer 101 that is laminated later and is disposed on a side far away from the substrate 110 becomes a magnetization-free layer, and the second ferromagnetic metal layer 103 that is laminated first and is disposed on a side close to the substrate 110 becomes a magnetization fixed layer (pin layer), but the structure of the magnetoresistance effect element 100 is not particularly limited, and a so-called top pin structure is also possible.

Power Supply

The magnetoresistance effect element 100 further includes a first power supply 140 that allows a current to flow in the lamination direction of the magnetoresistance effect element part 105, and a second power supply 150 that allows a current to flow to the spin-orbit torque wiring 120.

The first power supply 140 is connected to the wiring 130 and the spin-orbit torque wiring 120. The first power supply 140 can control a current that flows in the lamination direction of the magnetoresistance effect element 100.

The second power supply 150 is connected to both ends of the spin-orbit torque wiring 120. The second power supply 150 can control a current that is a current that flows in a direction orthogonal to the lamination direction of the magnetoresistance effect element part 105, that is, a current that flows to the spin-orbit torque wiring 120.

As described above, the current that flows in the lamination direction of magnetoresistance effect element part 105 causes STT. In contrast, the current that flows to the spin-orbit torque wiring 120 causes SOT. Both of the STT and the SOT contribute to magnetization reversal of the first ferromagnetic metal layer 101.

As described above, the amount of currents, which respectively flow in the lamination direction of the magnetoresistance effect element part 105 and in a direction orthogonal to the lamination direction, is controlled by the two power supplies, and thus it is possible to freely control contribution rates of the SOT and the STT with respect to the magnetization reversal.

For example, in a case where it is difficult to flow a large current to a device, a control may be performed so that the STT with high energy efficiency with respect to the magnetization reversal becomes a main type. That is, the amount of current that flows from the first power supply 140 may be increased, and the amount of current that flows from the second power supply 150 may be decreased.

In addition, for example, in a case where it is necessary to prepare a thin device, and thus it is necessary to make the thickness of the nonmagnetic layer 102 be small, it is required to reduce a current that flows to the nonmagnetic layer 102. In this case, the amount of current that flows from the first power supply 140 may be reduced, and the amount of current that flows from the second power supply 150 may be increased to enhance the contribution rate of the SOT.

A known power supply can be used as the first power supply 140 and the second power supply 150.

As described above, according to the magnetoresistance effect element of the embodiment in a case of the configuration using the STT type and the SOT type in combination, the contribution rate of the STT and the SOT can be freely controlled by the amount of currents which are supplied from the first power supply and the second power supply. According to this, it is possible to freely control the contribution rate of the STT and the SOT in correspondence with a performance that is required for a device, and thus the magnetoresistance effect element can function as a magnetoresistance effect element with relatively high general-purpose properties.

Manufacturing Method

A method of manufacturing the spin current magnetization rotational element and the magnetoresistance effect element including the spin current magnetization rotation element according to the embodiment is not particularly limited, and a known film formation method can be used. With regard to the film formation method, for example, as a physical vapor deposition (PVD) method, resistive heating deposition, electron beam deposition, a molecular beam epitaxy (MBE) method, an ion plating method, an ion beam deposition method, a sputtering method, and the like can be used. Alternatively, as a chemical vapor deposition (CVD) method, a thermal CVD method, an optical CVD method, a plasma CVD method, a metalorganic chemical vapor deposition (MOCVD), an atomic layer deposition (ALD) method, and the like can be used. In addition, a single atom layer doping method (delta doping method) can be used to form a very thin interface spin generation layer having a thickness that is approximately two or less times an atomic radius.

The spin-orbit torque wiring and the first ferromagnetic metal layer can be formed, for example, by using a magnetron sputtering apparatus. After film formation, a resist or a protective film is provided on a portion at which the spin current magnetization rotational element is desired to be prepared, and an unnecessary portion is removed by using an ion milling method or a reactive ion etching (RIE) method.

In the first ferromagnetic metal layer, to enlarge a cross-sectional area of a cross-section orthogonal to a plane-orthogonal direction as it becomes closer to the spin-orbit torque wiring, an apparatus including a mechanism capable of changing a relative angle (angle θ from the z-axis) between an ion irradiation direction in the ion milling or RIE, and the spin current magnetization rotational element 10 is used. A technology capable of forming an element with good horny ratio or an element having a truncated shape by changing the relative angle of the ion irradiation with respect to the spin current magnetization rotational element 10 is known.

In addition, in a case where the spin-orbit torque wiring includes the pure spin current generating portion and the low-resistance portion, a relative angle is fixed to 30° to 80° with respect to a spin current magnetization reversal laminated film that is provided with a resist or a protective film, and the spin generating portion is milled. According to this, it is possible to form a spin generating portion having a linear inclination. In addition, it is possible to form a spin generating portion having a curved inclination by performing milling while changing the relative angle during the milling. Then, the low-resistance portion is formed, a resist or a protective film is provided, and then milling is performed. According to this, it is possible to form the low-resistance portion in a shape of the spin-orbit torque wiring.

For example, when preparing the magnetoresistance effect element by using a sputtering method, in a case where the magnetoresistance effect element is the TMR element, for example, a tunnel barrier layer is formed as follows. First, a metal thin film including magnesium, aluminum, and divalent cations of a plurality of nonmagnetic elements is sputtered onto the first ferromagnetic metal layer in a thickness of approximately 0.4 to 2.0 nm, and plasma oxidation or natural oxidation due to instruction of oxygen is performed. Then, a heat treatment is performed.

It is preferable that the resultant laminated film that is obtained is subjected to an annealing treatment. A layer that is formed through reactive sputtering is amorphous, and thus it is necessary to crystallize the layer. For example, in a case of using Co—Fe—B as the ferromagnetic metal layer, a part of B is leaked due to the annealing treatment, and thus the layer is crystallized.

In the magnetoresistance effect element that is prepared through the annealing treatment, a magnetoresistance ratio is further improved in comparison to a magnetoresistance effect element that is prepared without being subjected to the annealing treatment. The reason for this is considered to be because uniformity in a crystal size and orientation of the tunnel barrier layer of the nonmagnetic layer are improved due to the annealing treatment.

With regard to the annealing treatment, it is preferable that heating is performed at a temperature of 300° C. to 500° C. for 5 minutes to 100 minutes in an inert atmosphere such as Ar, and heating is performed at a temperature of 144° C. to 500° C. for 1 hour to 10 hours in a state in which a magnetic field of 2 kOe to 10 kOe is applied.

As a method of shaping the magnetoresistance effect element into a predetermined shape, a processing method such as photolithography can be used. First, the magnetoresistance effect element is laminated, and a surface, which is opposite to the spin-orbit torque wiring, of the magnetoresistance effect element is coated with a resist. Then, the resist in a predetermined portion is cured to remove the resist in an unnecessary portion. A portion in which the resist is cured becomes a protective film of the magnetoresistance effect element. The portion in which the resist is cured matches the shape of the magnetoresistance effect element that is finally obtained.

In addition, the surface on which the protective film is formed is subjected to a treatment such as ion milling and reactive ion etching (RIE). A portion in which the protective film is not formed is removed, and thus a magnetoresistance effect element having a predetermined shape is obtained.

Magnetic Memory

A magnetic memory (MRAM) of the embodiment includes a plurality of the magnetoresistance effect elements of the embodiment.

The thickness of each layer can be measured, for example, by a TEM or a period of peaks in element analysis.

EXPLANATION OF REFERENCES

1 First ferromagnetic metal layer
2 Spin-orbit torque wiring
10 spin current magnetization rotational element (spin current magnetization reversal element)
100 Magnetoresistance effect element
101 First ferromagnetic metal layer
102 Nonmagnetic layer
103 Second ferromagnetic metal layer
104 Cap layer
105 Magnetoresistance effect element unit
110 Substrate
120 Spin-orbit torque wiring
130 Wiring
140 First power supply
150 Second power supply

What is claimed is:

1. A spin current magnetization rotational element, comprising:
   a first ferromagnetic metal layer in which a magnetization direction is variable; and
   a spin-orbit torque wiring that extends in a second direction intersecting a first direction that is a plane-orthogonal direction of the first ferromagnetic metal layer, and is joined to the first ferromagnetic metal layer,
   wherein the first ferromagnetic metal layer has a lamination structure including a plurality of ferromagnetic constituent layers and a plurality of nonmagnetic constituent layers which are respectively interposed between the ferromagnetic constituent layers adjacent to each other,
   at least one ferromagnetic constituent layer among the plurality of ferromagnetic constituent layers has a film thickness different from a film thickness of the other ferromagnetic constituent layers, and/or at least one nonmagnetic constituent layer among the plurality of nonmagnetic constituent layers has a film thickness different from a film thickness of the other nonmagnetic constituent layers, and
   the magnetization direction of the first ferromagnetic metal layer has an in-plane direction component parallel to the first ferromagnetic metal layer.

2. The spin current magnetization rotational element according to claim 1,
   wherein film thicknesses of two ferromagnetic constituent layers, between which one nonmagnetic constituent layer among the plurality of nonmagnetic constituent layers is interposed, among the plurality of ferromagnetic constituent layers are different from each other, or film thicknesses of two nonmagnetic constituent layers, between which one ferromagnetic constituent layer among the plurality of ferromagnetic constituent layers is interposed, among the plurality of nonmagnetic constituent layers are different from each other.

3. The spin current magnetization rotational element according to claim 1,
   wherein among the plurality of nonmagnetic constituent layers, a nonmagnetic laminated layer that is the closest to the spin-orbit torque wiring is thinner than the other nonmagnetic laminated layers.

4. The spin current magnetization rotational element according to claim 3,
   wherein among the plurality of ferromagnetic constituent layers, a ferromagnetic constituent layer that is closest to the spin-orbit torque wiring is thinner than the other ferromagnetic constituent layers.

5. The spin current magnetization rotational element according to claim 3,
   wherein, with respect to an average film thickness of the plurality of ferromagnetic constituent layers, a film thickness of each of the ferromagnetic constituent layers is different from the average film thickness by ±10% or more, or with respect to an average film thickness of the plurality of nonmagnetic constituent layers, a film thickness of each of nonmagnetic laminated layers is different from the average film thickness of the nonmagnetic laminated layers by ±10% or more.

6. The spin current magnetization rotational element according to claim 1,
   wherein among the plurality of nonmagnetic constituent layers, a material of at least one nonmagnetic constituent layer is different from a material of the other nonmagnetic constituent layers.

7. The spin current magnetization rotational element according to claim 6,
   wherein among the plurality of ferromagnetic constituent layers, a ferromagnetic constituent layer that is closest to the spin-orbit torque wiring is thinner than the other ferromagnetic constituent layers.

8. The spin current magnetization rotational element according to claim 1,
   wherein the nonmagnetic constituent layers are formed from a material that applies interface-orthogonal magnetic anisotropy to the ferromagnetic constituent layers.

9. The spin current magnetization rotational element according to claim 1,
   wherein among the plurality of ferromagnetic constituent layers, a ferromagnetic constituent layer that is closest to the spin-orbit torque wiring is thinner than the other ferromagnetic constituent layers.

10. The spin current magnetization rotational element according to claim 9,
    wherein any one ferromagnetic constituent layer among the plurality of ferromagnetic constituent layers includes a dead layer.

11. The spin current magnetization rotational element according to claim 9,
    wherein, with respect to an average film thickness of the plurality of ferromagnetic constituent layers, a film thickness of each of the ferromagnetic constituent layers is different from the average film thickness by ±10% or more, or with respect to an average film thickness of the plurality of nonmagnetic constituent layers, a film thickness of each of nonmagnetic laminated layers is different from the average film thickness of the nonmagnetic laminated layers by ±10% or more.

12. The spin current magnetization rotational element according to claim 1,
wherein any one ferromagnetic constituent layer among the plurality of ferromagnetic constituent layers includes a dead layer.

13. The spin current magnetization rotational element according to claim 1,
wherein, with respect to an average film thickness of the plurality of ferromagnetic constituent layers, a film thickness of each of the ferromagnetic constituent layers is different from the average film thickness by ±10% or more, or with respect to an average film thickness of the plurality of nonmagnetic constituent layers, a film thickness of each of nonmagnetic laminated layers is different from the average film thickness of the nonmagnetic laminated layers by ±10% or more.

14. The spin current magnetization rotational element according to claim 1,
wherein as the first ferromagnetic metal layer is closer to the spin-orbit torque wiring, a cross-sectional area of a cross-section that is orthogonal to the first direction is enlarged.

15. The spin current magnetization rotational element according to claim 1,
wherein sheet resistance of the first ferromagnetic metal layer is smaller than sheet resistance of the spin-orbit torque wiring.

16. The spin current magnetization rotational element according to claim 1,
wherein a material of the ferromagnetic constituent layers is selected from ferromagnetic metals including any one of Fe, Co, and Ni, and a material of the nonmagnetic constituent layers is selected from nonmagnetic metals including any one of Ti, Cr, Cu, Mo, Ru, Rh, Pd, Ag, Hf, Ta, W, Ir, Pt, Au, and Bi.

17. The spin current magnetization rotational element according to claim 1,
wherein a ratio of a length of the first ferromagnetic metal layer along the second direction to the thickness of the first ferromagnetic metal layer is 1 or greater.

18. A magnetoresistance effect element, comprising:
the spin current magnetization rotational element according to claim 1;
a second ferromagnetic metal layer in which a magnetization direction is fixed; and
a nonmagnetic layer that is interposed between the first ferromagnetic metal layer and the second ferromagnetic metal layer.

19. The magnetoresistance effect element according to claim 18,
wherein among the plurality of ferromagnetic constituent layers, a film thickness of a ferromagnetic constituent layer that is in contact with the nonmagnetic layer is the smallest.

20. A magnetic memory, comprising:
a plurality of the magnetoresistance effect elements according to claim 18.

* * * * *